(12) United States Patent
Tanaka et al.

(10) Patent No.: US 9,290,692 B2
(45) Date of Patent: Mar. 22, 2016

(54) POLYMER LIGHT-EMITTING MATERIAL, METHOD FOR PRODUCING THE SAME, AND ORGANIC ELECTROLUMINESCENT DEVICE

(75) Inventors: Hiroshige Tanaka, Kitakyushu (JP); Takaya Ishiyama, Kitakyushu (JP); Kazuto Shiraishi, Kitakyushu (JP); Tohru Asari, Kitakyushu (JP); Hiroyuki Hayashida, Kitakyushu (JP); Kazuaki Yoshimura, Kitakyushu (JP)

(73) Assignee: NIPPON STEEL & SUMIKIN CHEMICAL CO., LTD., Tokyo (JP)

( * ) Notice: Subject to any disclaimer, the term of this patent is extended or adjusted under 35 U.S.C. 154(b) by 1203 days.

(21) Appl. No.: 13/138,494

(22) PCT Filed: Feb. 25, 2010

(86) PCT No.: PCT/JP2010/052969
§ 371 (c)(1),
(2), (4) Date: Aug. 26, 2011

(87) PCT Pub. No.: WO2010/098387
PCT Pub. Date: Sep. 2, 2010

(65) Prior Publication Data
US 2011/0309342 A1    Dec. 22, 2011

(30) Foreign Application Priority Data
Feb. 27, 2009   (JP) .................................. 2009-046474

(51) Int. Cl.
C08F 8/42      (2006.01)
C09K 11/06     (2006.01)
H01L 51/54     (2006.01)
H01L 51/50     (2006.01)
H01L 51/00     (2006.01)

(52) U.S. Cl.
CPC . *C09K 11/06* (2013.01); *C08F 8/42* (2013.01); *H01L 51/004* (2013.01); *H01L 51/0043* (2013.01); *C09K 2211/1408* (2013.01); *C09K 2211/1425* (2013.01); *C09K 2211/185* (2013.01); *H01L 51/0084* (2013.01); *H01L 51/0085* (2013.01); *H01L 51/5012* (2013.01); *H01L 51/5016* (2013.01)

(58) Field of Classification Search
CPC .... C08F 8/42; C09K 11/06; C09K 2211/185; C09K 2211/1408; H01L 51/004; H01L 51/0043; H01L 51/0084; H01L 51/0085; H01L 51/5012; H01L 51/5016
USPC .......................... 525/370, 331.4, 333.4, 333.6
See application file for complete search history.

(56) References Cited

U.S. PATENT DOCUMENTS

| | | | |
|---|---|---|---|
| 5,756,224 A | 5/1998 | Borner et al. | |
| 6,545,159 B2 | 4/2003 | Lee et al. | |
| 2003/0091862 A1* | 5/2003 | Tokito et al. | 428/690 |
| 2003/0148142 A1 | 8/2003 | Fryd et al. | |
| 2004/0072018 A1* | 4/2004 | Herron et al. | 428/690 |
| 2004/0106006 A1 | 6/2004 | Eriyama et al. | |
| 2008/0050604 A1 | 2/2008 | Takahashi et al. | |
| 2008/0177084 A1 | 7/2008 | Lee et al. | |
| 2009/0124051 A1* | 5/2009 | Fukui | 438/151 |

FOREIGN PATENT DOCUMENTS

| | | |
|---|---|---|
| JP | 8-319482 A | 12/1996 |
| JP | 11-256148 A | 9/1999 |
| JP | 2002-293830 A | 10/2002 |
| JP | 2003-73479 A | 3/2003 |
| JP | 2003-73480 A | 3/2003 |
| JP | 2003-119179 A | 4/2003 |
| JP | 2003-342325 A | 12/2003 |
| JP | 2006-8996 A | 1/2006 |
| JP | 2006-503126 A | 1/2006 |
| JP | 2008-127387 A | 6/2008 |

OTHER PUBLICATIONS

English translation of International Preliminary Report on Patentability mailed Oct. 27, 2011, in PCT International Application No. PCT/JP2010/052969.
Adachi et al., "High-efficiency organic electrophosphorescent devices with tris(2-phenylpyridine)iridium doped into electron-transporting materials," Applied Physics Letters, vol. 77, No. 6, pp. 904-906, Aug. 7, 2000.
Extended European Search Report Issued Jul. 17, 2012, in European Patent Application No. 10746266.5.
International Search Report for PCT/JP2010/052969, mailed on May 18, 2010.

* cited by examiner

*Primary Examiner* — Roberto Rabago
(74) *Attorney, Agent, or Firm* — Birch, Stewart, Kolasch & Birch, LLP.

(57) ABSTRACT

Disclosed is a polymer light-emitting material for an organic electroluminescent device that displays excellent light-emitting performance and is applicable to a wet process. The polymer light-emitting material for an organic electroluminescent device is obtained by subjecting a thermoplastic resin having an Mw of 2,000-1,000,000 and containing a functional group in a unit constituting the backbone and a metal-containing phosphorescent dopant compound containing a reactive group capable of reacting with the said functional group to a polymer reaction so as to link a phosphorescent dopant moiety derived from the metal-containing phosphorescent dopant compound to the unit constituting the backbone of the thermoplastic resin. The content of the metal derived from the metal containing phosphorescent dopant compound in the said polymer light-emitting material is 0.001-20 wt %.

5 Claims, No Drawings

POLYMER LIGHT-EMITTING MATERIAL, METHOD FOR PRODUCING THE SAME, AND ORGANIC ELECTROLUMINESCENT DEVICE

FIELD OF TECHNOLOGY

This invention relates to an organic electroluminescent material, a method for producing the same, and an organic electroluminescent device using the said material.

BACKGROUND TECHNOLOGY

Electroluminescent devices are generally classified into inorganic electroluminescent devices that use inorganic compounds in the light-emitting devices and organic electroluminescent devices that use organic compounds in the light emitting devices. In recent years, studies are underway with emphasis laid on putting organic electroluminescent devices to practical use on account of their distinctive feature of emitting light of high luminance at low voltage.

An organic electroluminescent device is basically constructed by forming a hole-injecting layer on a glass plate on which a thin film of an anode material such as indium tin oxide (ITO) is vapor-deposited, then forming a thin film of an organic layer such as a light-emitting layer on the hole-injecting layer, and finally forming a thin film of a cathode material on the organic layer. Some devices are constructed by suitably adding a hole-transporting layer or an electron-transporting layer to this basic structure. Examples of the layered structure of an organic electroluminescent device include anode/hole-injecting layer/light-emitting layer/electron-transporting layer/cathode and anode/hole-injecting layer/hole-transporting layer/light emitting layer/electron-transporting layer/cathode.

Light-emitting materials to be used in the light-emitting layer of an organic electroluminescent device are roughly classified into low-molecular-weight light-emitting materials and high-molecular-weight light-emitting materials.

A low-molecular-weight light-emitting material is formed into a film for the light-emitting layer mainly by the vacuum vapor deposition process and this film-forming process is characterized in that a variety of materials having different functions can be readily piled one upon another to form a multilayer structure and this enables fabrication of an organic electroluminescent device of high performance. However, as the display panels become larger in size and finer, this process faces problems in that a uniform control of the film thickness becomes difficult to exercise and color separation becomes difficult to perform and, besides, the production cost rises as the process requires a large-scale vacuum apparatus.

Studies are also underway to develop a practical film-forming process based on solution coating for forming a light-emitting layer from a low-molecular-weight light-emitting material. However, segregation and phase separation are observed as a low-molecular-weight compound crystallizes on application of this technique and further improvements are needed to achieve a level of practical use.

On the other hand, since the vacuum vapor deposition process is not applicable as a film-forming process to practically all of high-molecular-weight light-emitting materials, a process based on solution coating such as spin coating, printing, and ink-jet coating is used instead. This process is readily applicable to large-size panels and excellently suited to mass production; however, the problem this process faces is that coating solutions are difficult to apply layer by layer to form a laminated film and contaminants enter with ease. For this reason, devices using high-molecular-weight light-emitting materials are inferior to devices using low-molecular-weight light-emitting materials in properties such as luminous efficiency and lifetime. Under these circumstances, a demand has been created for high-molecular-weight light-emitting materials having excellent luminous properties and good film-formability.

In attempts to meet the aforementioned property requirements, patent documents 1 and 2 and non-patent document 1 report that utilization of phosphorescence enables fabrication of organic electroluminescent devices of high luminous efficiency. However, the organic electroluminescent devices disclosed in these documents display luminous efficiency and stability as insufficient as those of ordinary fluorescent electroluminescent devices and they fail to make sufficient improvements.

Further, as a means to enhance the luminous efficiency of an organic electroluminescent device, patent documents 3 and 4 disclose a polymer light-emitting material comprising a metal complex moiety as a phosphorescent dopant obtained by metal complexation of a ligand moiety partly incorporated in the backbone or side chain of a polyarylene which is a $\pi$-conjugated polymer and also disclose a light-emitting device using the said polymer light-emitting material. However, this material cannot yield a light-emitting device of high luminous efficiency because the metal complexation is not sufficient to provide functionality as a phosphorescent dopant and the phosphorescence quantum efficiency ascribable to the $\pi$-conjugation system of the polymer is low. Further, $\pi$-conjugated polymers are poorly soluble in organic solvents and they are not suitable for use in film forming by a solution coating process.

Patent document 5 discloses a polymer light-emitting material of high solvent solubility and large phosphorescence energy comprising a metal complex moiety as a phosphorescent dopant incorporated by metal complexation of a ligand moiety partly introduced to the backbone of polyethylene. Although the phosphorescent luminous efficiency is expected to be enhanced by introduction of the polyethylene backbone, the metal complexation is not sufficient to provide functionality as a phosphorescent dopant and it cannot be said that the anticipated performance is fully displayed.

Further, patent documents 6 and 7 disclose the use of polymerization or copolymerization of a polymerizable phosphorescent dopant compound (an iridium complex) to produce a polyethylene resin in which iridium complexes are linked to the backbone as a polymer light-emitting material. However, this synthetic method yields a polymer containing blocks of the iridium complex thereby creating a condition under which the concentration of light-emitting excitons becomes too high locally or a condition of the so-called concentration quenching or concentration deactivation and lowering the luminous efficiency. Hence, it is difficult to raise the concentration of the iridium complex. Furthermore, a vinyl compound to which an iridium complex is linked shows low solubility in a polymerization reaction solvent and it is difficult to raise the concentration of the iridium complex in the polymer. This in turn makes it difficult to form a film containing a sufficient concentration of the iridium complex, that is, it is difficult to say that sufficient light-emitting performance can be extracted by this method.

Patent document 1: JP H8-319482 A
Patent document 2: JP H11-256148 A
Patent document 3: JP2003-73479 A
Patent document 4: JP2003-73480 A
Patent document 5: JP2002-293830 A
Patent document 6: JP2003-119179 A
Patent document 7: JP2006-008996 A
Non-patent document 1: Appl. Phys. Lett., 77, 904 (2000)

SUMMARY OF THE INVENTION

In applications of polymer light-emitting materials containing phosphorescent dopants to organic electroluminescent devices, it is necessary to enhance the luminous efficiency and make improvements in the stability of film, solubility in solvents, and film-formability.

Under the aforementioned circumstances, an object of this invention is to provide a polymer light-emitting material for an organic electroluminescent device that displays enhanced luminous efficiency and is applicable to a wet film-forming process. Another object of this invention is to provide an organic electroluminescent device that uses the said polymer light-emitting material and is useful as backlight for lighting equipment, image display devices, and display devices and to provide a planar light emitter that uses the said organic electroluminescent device.

The inventors of this invention have found as a result of intensive studies that the use of a polymer light-emitting material obtained by subjecting a thermoplastic resin containing a functional group and a phosphorescent dopant compound containing a reactive group capable of reacting with the said functional group to a polymer reaction so as to introduce the phosphorescent dopant compound as a side chain to the thermoplastic resin improves the light-emitting performance and completed this invention. The polymer reaction here refers to the reaction wherein a resin (polymer) containing a reactive functional group is allowed to react with a low-molecular-weight compound containing a reactive group capable of reacting with the said functional group in such a manner as to link the said low-molecular-weight compound to the resin as a side chain. This invention uses a metal complex formed in advance is used as a low-molecular-weight compound and does not include a polymer reaction for forming a metal complex.

Accordingly, this invention relates to a polymer light-emitting material obtained by subjecting a thermoplastic resin having a weight average molecular weight of 2,000-1,000,000 and containing a reactive functional group in a unit constituting the backbone and a metal-containing phosphorescent dopant compound containing a reactive group capable of reacting with the said functional group to a polymer reaction so as to link a phosphorescent dopant moiety derived from the metal-containing phosphorescent dopant compound to the unit constituting the backbone of the thermoplastic resin wherein the content of the metal in the said polymer light-emitting material is 0.001-20 wt %.

Another aspect of this invention relates to a method for producing the aforementioned polymer light-emitting material for an organic electroluminescent device which comprises mixing a thermoplastic resin having a weight average molecular weight of 2,000-1,000,000 and containing a reactive functional group in a unit constituting the backbone and a metal-containing phosphorescent dopant compound containing a reactive group capable of reacting with the said functional group and allowing the said functional group to react with the said reactive group.

Another aspect of this invention relates to a polymer light-emitting material obtained by subjecting a thermoplastic resin having a weight average molecular weight of 2,000-1,000,000 and containing a reactive functional group in a unit constituting the backbone, a metal-containing phosphorescent dopant compound containing a reactive group capable of reacting with the said functional group, and a carrier-transporting compound containing a reactive group capable of reacting with the said functional group to a polymer reaction so as to link a phosphorescent dopant moiety derived from the metal-containing phosphorescent dopant compound and a carrier-transporting compound moiety derived from the carrier-transporting compound to the unit constituting the backbone of the thermoplastic resin wherein the content of the metal in the said polymer light-emitting material is 0.001-20 wt %.

A further aspect of this invention relates to a method for producing the aforementioned polymer light-emitting material which comprises allowing a thermoplastic resin having a weight average molecular weight of 2,000-1,000,000 and containing a reactive functional group in a unit constituting the backbone to react first partly with a metal-containing phosphorescent dopant compound containing a reactive group capable of reacting with the said functional group and then with a carrier-transporting compound containing a reactive group capable of reacting with the said functional group.

A further aspect of this invention relates to an organic electroluminescent device containing a light-emitting layer between an anode layer and a cathode layer piled one upon another on a substrate wherein the said light-emitting layer comprises the aforementioned polymer light-emitting material. A still further mode of this invention relates to a planar light emitter comprising the aforementioned organic electroluminescent device.

A preferable example of thermoplastic resins having a weight average molecular weight of 2,000-1,000,000 is a polychloromethylstyrene resin. Preferable examples of metal-containing phosphorescent dopant compounds containing a reactive group include organic metal complexes containing at least one metal selected from ruthenium, rhodium, palladium, silver, rhenium, osmium, iridium, platinum, and gold and a typical example of the reactive group is a hydroxyl group or a precursor thereof.

PREFERRED EMBODIMENTS OF THE INVENTION

A polymer light-emitting material in this invention is obtained by the reaction of a thermoplastic resin having a weight average molecular weight of 2,000-1,000,000 and containing a reactive functional group in a unit constituting the backbone (hereinafter referred to as a functional group-containing thermoplastic resin or a thermoplastic resin) with a metal-containing phosphorescent dopant compound containing a reactive group capable of reacting with the said functional group (hereinafter referred to as a reactive group-containing phosphorescent dopant compound or a phosphorescent dopant compound).

A functional group-containing thermoplastic resin to be used in this invention has functional groups in a unit constituting the backbone. Here, the unit constituting the backbone means a repeating unit and the repeating unit may consist of one species or of two species or more. However, the functional groups in the backbone are preferably arranged at as constant intervals as possible and, in this respect, the repeating unit advantageously consists of one species. The repeating unit is expressed, for example, as -(A)- or -(A-B)- and at least A contains the aforementioned functional groups. The backbone refers to the main chain of a linear polymer or the main chain and branched chain of a branched polymer.

The functional group of a functional group-containing thermoplastic resin means a functional group capable of reacting with the reactive group of a reactive group-containing phosphorescent dopant compound and there is no restriction on it as long as it can react with the said reactive group so as to link a phosphorescent dopant moiety derived from the phosphorescent dopant compound to a unit constituting the backbone.

Examples of the linkages thereby generated include an ether linkage, an alkyl linkage, an ester linkage, a sulfide linkage, an amide linkage, and an isocyanate linkage, but not a chelate linkage.

There is no restriction on a functional group-containing thermoplastic resin as long as the resin contains a functional group of the aforementioned kind and the resin may be either a homopolymer or a copolymer. For example, a thermoplastic resin obtained by polymerizing a functional group-containing monomer is preferred. Examples of a functional group-containing monomer include a vinyl compound such as an olefin and a dicarboxylic acid-diol combination to be used as raw materials for a polyester resin. In the case of the latter, at least one of the two needs to have a functional group.

A thermoplastic resin obtained by polymerizing a vinyl compound is preferable as a functional group-containing thermoplastic resin. One species or two species or more of vinyl compounds may be used here and, in the case where two species or more are used, at least one species needs to be a functional group-containing vinyl compound.

Examples of functional group-containing vinyl compounds include halogenated vinyl compounds such as p-chloromethylstyrene, p-bromomethylstyrene, p-iodomethylstyrene, o-chloromethylstyrene, o-bromomethylstyrene, p-iodomethylstyrene, m-chloromethylstyrene, m-bromomethylstyrene, and m-iodomethylstyrene and hydroxyl group-containing vinyl compounds such as p-hydroxystyrene, o-hydroxystyrene, m-hydroxystyrene, p-hydroxymethylstyrene, and hydroxyethyl methacrylate. Preferable examples include halo alkyl-substituted aromatic vinyl compounds such as a halomethylstyrene and hydroxyalkyl-substituted styrenes such as hydroxymethylstyrene.

From the viewpoint of cost and versatility, a polychloromethylstyrene resin obtained using chloromethylstyrene as a monomer is preferable as a functional group-containing thermoplastic resin. A poly(p-chloromethylstyrene) resin is more preferable.

In the polymer light-emitting material of this invention, the polymer chain of the thermoplastic resin acts as a host toward a dopant. In order to obtain high luminous efficiency, it is preferable to select a thermoplastic resin in which the polymer chain displays sufficient performance as a host. Suitable as such is a thermoplastic resin containing a polystyrene chain or a polyolefin chain. A polymer chain that is to function as a host moiety is required to have a higher triplet excitation energy level (hereinafter referred to as T1) than a phosphorescent dopant moiety and it is easy to select a thermoplastic resin having a polymer chain satisfying the aforementioned requirement because the value of T1 is characteristic of a given compound and equal to the lowest value of the triplet excitation energy calculated on the basis of the molecular structure of the polymer chain.

A functional group-containing thermoplastic resin can be produced by polymerizing a functional group-containing monomer in accordance with a known method. The weight average molecular weight of this thermoplastic resin is 2,000-1,000,000, preferably 10,000-300,000. When the weight average molecular weight is not more than 2,000, it becomes difficult to form a uniform film. On the other hand, when the weight average molecular weight exceeds 1,000,000, the solubility in organic solvents becomes extremely poor and a solution of the resin becomes difficult to apply by a solution coating process.

A phosphorescent dopant compound to be subjected to a reaction with a functional group-containing thermoplastic resin has a reactive group capable of reacting with the said functional group. This reactive group of the phosphorescent dopant compound varies with the aforementioned functional group to be paired. For example, in the case where the functional group is a chloromethyl group and the reactive group is a hydroxyl group or an alkoxyl group, the pair participate in a dehydration reaction or a dealcoholization reaction to form an ether linkage and coupling of the pair occurs. In the case where the functional group is a hydroxyl group and the reactive group is chlorine or a halogen-containing group such as a chloromethyl group, coupling occurs similarly. Further, when one of the pair has an aromatic ring and the other has an unsaturated group such as a vinyl group, coupling occurs via an alkylation reaction.

Therefore, the groups similar to the functional groups of the functional group-containing thermoplastic resins may be cited as examples of the reactive groups of the reactive group-containing phosphorescent dopant compounds. However, since the functional group must react with the reactive group, the two cannot be identical with each other at the same time. Examples of the reactive group include a halogen, a hydroxyl group, an alkoxyl group, an alkoxide, a phenoxide, and a thiol group. Preferable examples include a hydroxyl group or a precursor thereof. Here, the precursor of a hydroxyl group refers to a group such as an alkoxide that readily yields a hydroxyl group via hydrolysis or the like.

No restriction is imposed on a reactive group-containing phosphorescent dopant compound as long as the compound in question has a function of a phosphorescent dopant and preferable examples include reactive group-containing organic metal complexes at least one metal selected from ruthenium, rhodium, palladium, silver, rhenium, osmium, iridium, platinum, and gold. Reactive group-containing organic metal complexes can be selected from known organic metal complexes reported in the aforementioned patent documents and elsewhere. In the case where such organic metal complexes contain no reactive groups, suitable reactive groups need to be introduced to them.

In order to enhance the luminous efficiency, it is preferable to use iridium complexes such as Ir(ppy)3 and IrBt2.acac to which reactive groups are introduced.

Examples of phosphorescent dopant compounds are illustrated below, but they are not limited thereto. The phosphorescent dopant compounds are illustrated in the state free of reactive groups. Since a phosphorescent dopant compound containing a reactive group is obtained by introducing a reactive group such as a hydroxyl group to one of the benzene rings in a reactive group-free compound, the nature of a compound containing a reactive group can be readily understood from the phosphorescent dopant compounds illustrated below.

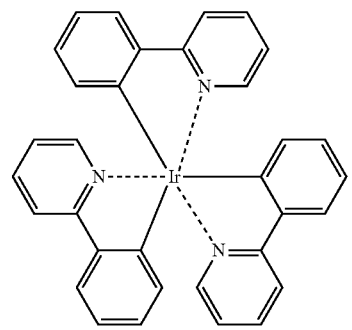

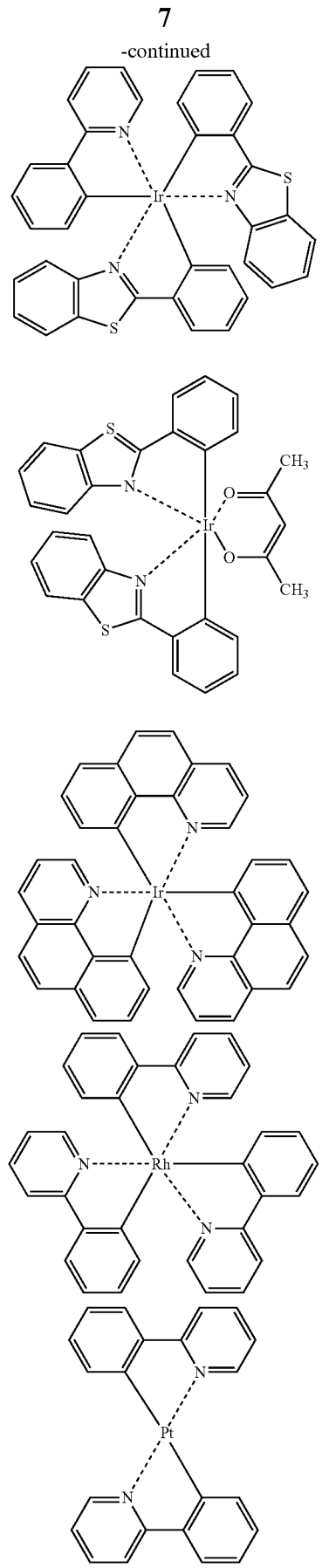
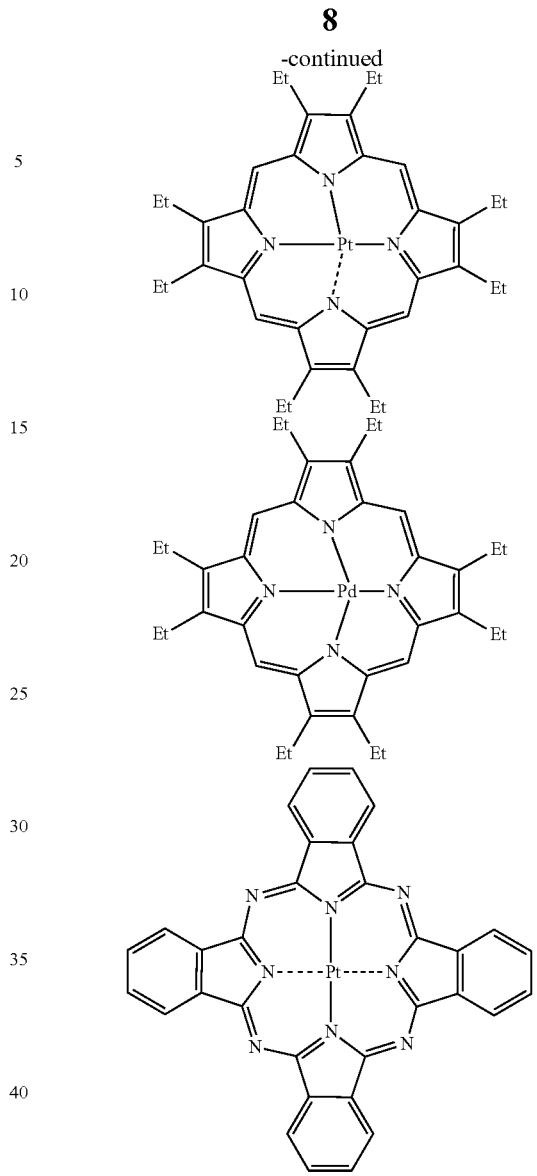

Polymer light-emitting materials are made to emit light of various wavelengths by varying the kind of phosphorescent dopant compounds.

A functional group-containing thermoplastic resin is allowed to react with a reactive group-containing phosphorescent dopant compound to yield a polymer light-emitting material and this reaction utilizes a polymer reaction of a low-molecular-weight phosphorescent dopant compound with a thermoplastic resin. Here, the polymer reaction refers to a coupling reaction wherein the functional group of a functional group-containing thermoplastic resin reacts with the reactive group of a reactive group-containing phosphorescent dopant compound and a phosphorescent dopant moiety derived from the phosphorescent dopant compound is linked to the thermoplastic resin. This reaction may be an addition reaction, a condensation reaction accompanied by dehydration, or a substitution reaction and a condensation reaction is suited. In the case of a condensation reaction, the phosphorescent dopant moiety is understood to mean a group remaining after elimination of the reactive group from the phosphorescent dopant compound in the reaction. In other words, the phosphorescent dopant moiety is understood to be a moiety (residual group) derived from a reactive group-containing phosphorescent dopant compound.

The reaction of a functional group-containing thermoplastic resin with a reactive group-containing phosphorescent dopant compound capable of reacting with the said functional group is preferably carried out in a polar aprotic solvent. Examples of the solvent include dimethylformamide, dimethylacetamide, dimethyl sulfoxide, and N-methylpyrrolidone and dimethylformamide is preferred. There is no specific restriction on the reaction temperature and a temperature of 40° C. or above is desirable to obtain a resin at a high substitution rate while a temperature of 70° C. or below is desirable to prevent gelation. The reaction time is preferably 1-72 hours.

The content of the metal in a polymer light-emitting material in this invention is 0.001-20 wt %, preferably 0.1-20 wt %, more preferably 1-15 wt %. When the metal content is less than 0.001 wt %, the concentration of a light-emitting material decreases and sufficient light-emitting performance is not obtained. When the metal content exceeds 20 wt %, stable light-emitting performance is not obtained due to concentration quenching. The metal content can be controlled properly, for example, by controlling the ratio of a functional group-containing thermoplastic resin to a reactive group-containing phosphorescent dopant compound to be submitted to the reaction. The metal content refers to the amount of the metal existing in the phosphorescent dopant compound moiety derived from the metal-containing phosphorescent dopant compound and the content of the phosphorescent dopant compound moiety existing in the polymer light-emitting material can be calculated from this metal content.

The ratio of a functional group-containing thermoplastic resin to a reactive group-containing phosphorescent dopant compound is the ratio at which at least a part of the functional group of the former reacts with the reactive group of the latter and the molar ratio of the reactive group to the functional group is preferably controlled in the range of 0.01-1.0, preferably 0.05-0.5 (the theoretical molar ratio is 1.0). In the case where the functional groups of the thermoplastic resin are unstable and some of them remain after the reaction, it is preferable to stabilize the functional groups by treating with a compound that is inert to the light-emitting material (for example, a phenolic compound in the case where the functional group is a halomethyl group).

Furthermore, according to this invention, a light-emitting material displaying excellent luminous efficiency, reduced concentration quenching, and improved stability can be obtained by subjecting a functional group-containing thermoplastic resin, a reactive group-containing phosphorescent light-emitting compound capable of reacting with the said functional group, and a carrier-transporting compound containing a reactive group capable of reacting with the said functional group to a polymer reaction so as to introduce the phosphorescent light-emitting compound and the carrier-transporting compound to the polymer chain of the thermoplastic resin.

Polymer light-emitting materials for organic electroluminescent devices in this invention include a polymer light-emitting material obtained by subjecting a functional group-containing thermoplastic resin, a reactive group-containing phosphorescent dopant compound capable of reacting with the said functional group, and a carrier-transporting compound containing a reactive group capable of reacting with the said functional group to a polymer reaction so as to link a phosphorescent dopant moiety derived from the phosphorescent dopant compound and a carrier-transporting compound moiety derived from the compound to a unit constituting the backbone of the thermoplastic resin.

In the aforementioned polymer reaction, those functional group-containing thermoplastic resins and reactive group-containing phosphorescent dopant compounds which were described earlier are used. As a carrier-transporting compound containing a reactive group capable of reacting with the functional group of the thermoplastic resin (hereinafter referred to as a reactive group-containing carrier-transporting compound or a carrier-transporting compound), either a reactive group-containing hole-transporting compound or a reactive group-containing electron-transporting compound is used. Here, examples of the reactive groups contained in the hole-transporting and electron-transporting compounds are the same as those of the reactive group-containing phosphorescent dopant compounds.

Examples of the reactive group-containing hole-transporting compounds include triphenylamine derivatives and carbazole derivatives. Examples of the reactive group-containing electron-transporting compounds include oxadiazole derivatives, imidazole derivatives, and triazole derivatives.

The reactive group-containing hole-transporting compounds are illustrated below, but they are not limited thereto. It is to be noted that the hole-transporting compounds illustrated below are in the state free of reactive groups. Since a reactive group-containing hole-transporting compound is formed by introducing a reactive group such as a hydroxyl group to one of benzene rings of a reactive group-free compound, the nature of a reactive group-containing hole-transporting compound can be understood readily from the hole-transporting compounds illustrated below.

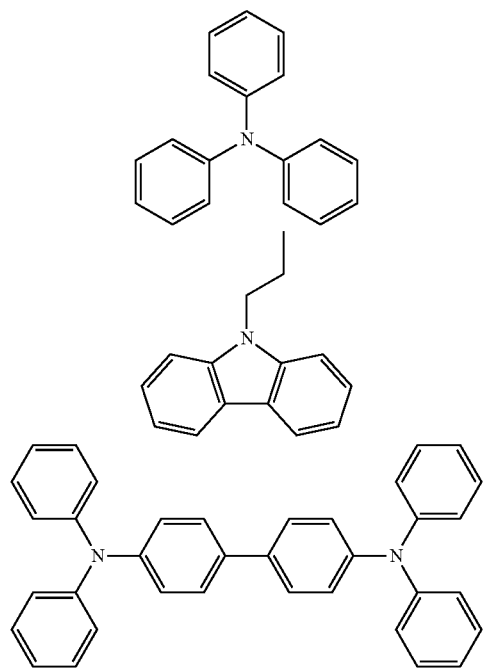

-continued

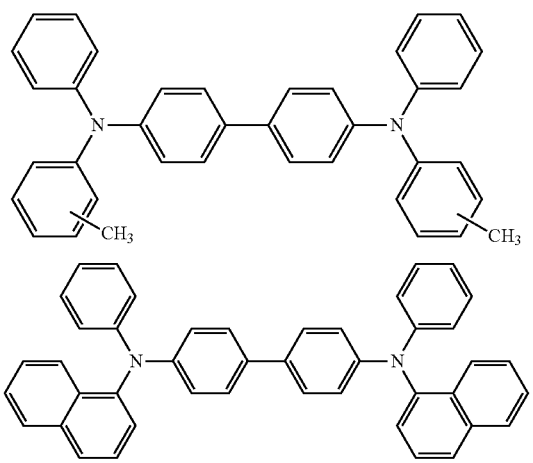

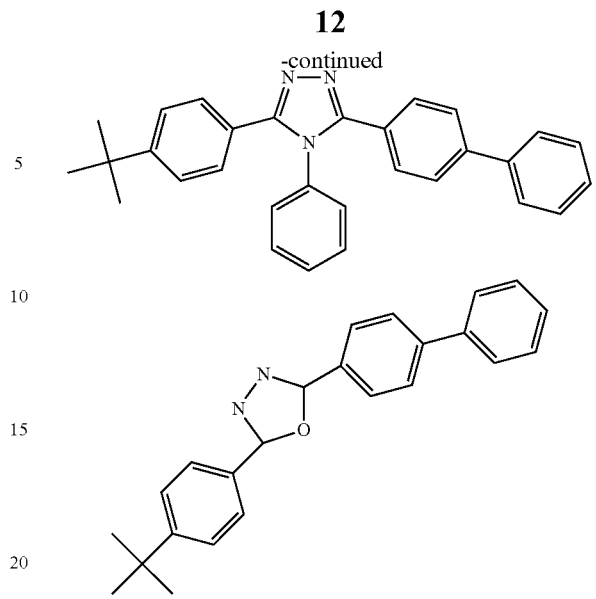

The reactive group-containing electron-transporting compounds are illustrated below, but they are not limited thereto. It is to be noted that the electron-transporting compounds illustrated below are in the state free of reactive groups. Since a reactive group-containing electron-transporting compound is formed by introducing a reactive group such as a hydroxyl group to one of benzene rings in a reactive group-free compound, the nature of a reactive group-containing electron-transporting compound can be understood readily from the electron-transporting compounds illustrated below.

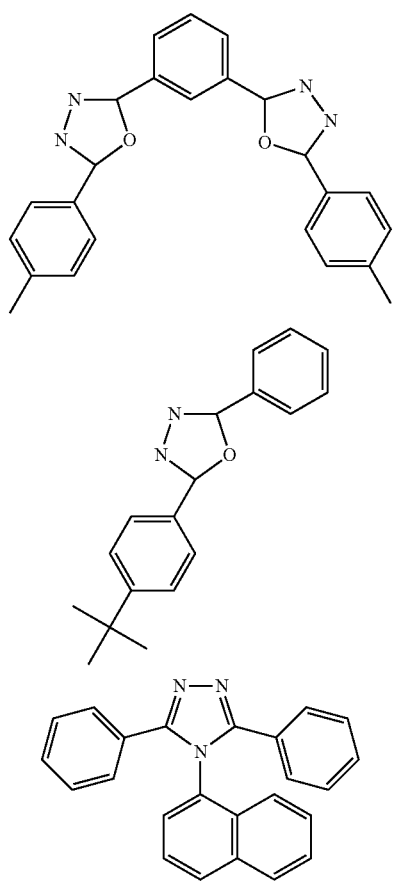

The reaction of a functional group-containing thermoplastic resin with a reactive group-containing carrier-transporting compound can be carried out in the same manner as the reaction of a functional group-containing thermoplastic resin with a reactive group-containing phosphorescent dopant compound. The polymer reaction of a reactive group-containing carrier-transporting compound means a coupling reaction wherein the functional group of a functional group-containing thermoplastic resin reacts with the reactive group of a reactive group-containing carrier-transporting compound so as to link a carrier-transporting compound moiety derived from the carrier-transporting compound to the thermoplastic resin. This reaction may be an addition reaction, a condensation reaction accompanied by dehydration, or a substitution reaction and a condensation reaction is suitable. In the case of a condensation reaction, it is to be understood that the carrier-transporting compound moiety means the reactive group-containing carrier-transporting compound less the group (atoms in a portion of the reactive group) eliminated by the condensation reaction. In other words, it is to be understood that the carrier-transporting compound moiety in a polymer light-emitting material is a moiety (a residual group) derived from the reactive group-containing carrier-transporting compound.

The aforementioned reaction can be carried out by reacting a functional group-containing thermoplastic resin first partly with a reactive group-containing phosphorescent dopant compound and then with a reactive group-containing carrier-transporting compound or vice versa; however, it is preferable to perform first the reaction with a reactive group-containing phosphorescent dopant compound. The ratio of a reactive group-containing phosphorescent dopant compound to a reactive group-containing carrier-transporting compound on a molar basis is preferably 1 mole of the former to 0.1-20 moles of the latter.

An aprotic solvent is preferably used in the reaction of a reactive group-containing carrier-transporting compound with a functional group-containing thermoplastic resin and examples of the aprotic solvent includes dimethylformamide, dimethylacetamide, dimethyl sulfoxide, and N-methylpyrrolidone. Of these solvents, dimethylformamide is preferred. The reaction temperature is not specifically limited and it is preferably controlled at 40° C. or above to obtain a resin at a high rate of substitution in each reaction; however, it is desirable to control the temperature at 70° C. or below to prevent gelation. The reaction time is preferably 1-72 hours.

Examples of polymer light-emitting materials in this invention are shown below, but are not limited thereto. Polymer light-emitting materials having a phosphorescent dopant moiety for use in organic electroluminescent devices are shown first and polymer light-emitting materials having a phosphorescent dopant moiety and a carrier-transporting compound moiety for use in organic electroluminescent devices are shown next. The functional chloromethyl groups may remain as they are in any of the polymer light-emitting materials or they may be treated for stabilization by a known method according to the need. In the formulas, n denotes a molar ratio of the unit containing the chloromethyl group, m denotes a molar ratio of the unit containing the dopant moiety, and q denotes a molar ratio of the unit containing the carrier-transporting group and these symbols do not mean a ratio of blocks. The phosphorescent dopant moieties are linked to the polymer chain roughly at regular intervals and so are the phosphorescene dopant moieties and the carrier-transporting compound moieties.

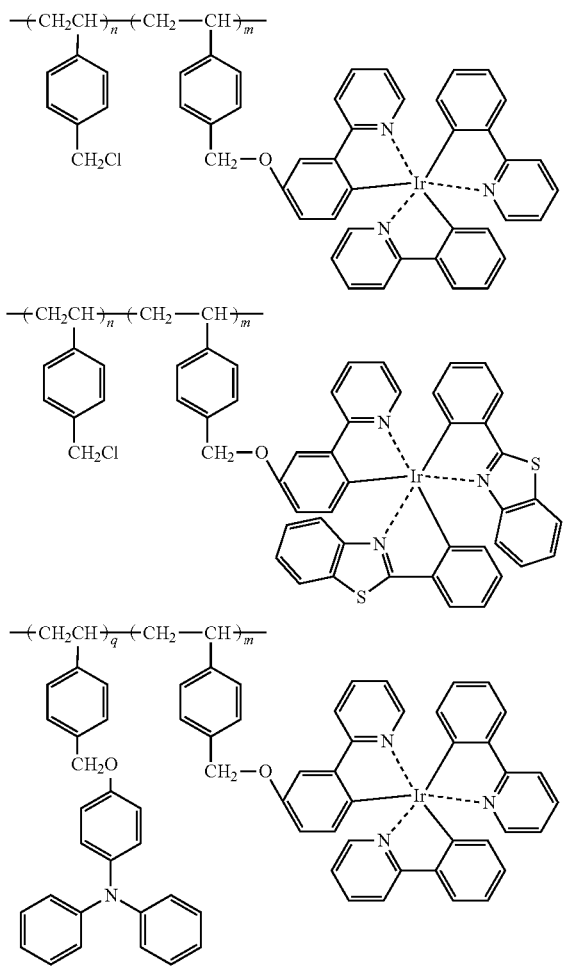

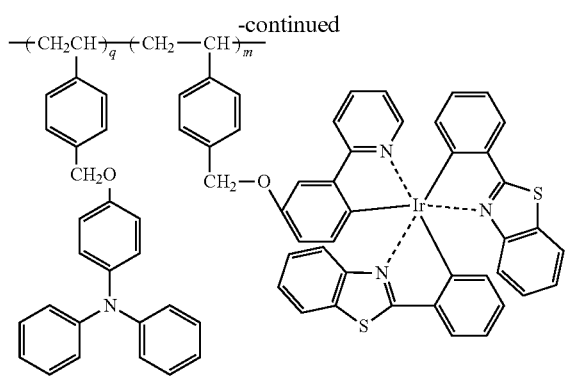

A polymer light-emitting material in this invention can be used as it is in the light-emitting layer of an organic electroluminescent device because the polymer backbone functions as a host and a metal complex linked to the backbone functions as a dopant. In the case where a carrier transport performance becomes insufficient, carrier-transporting groups are introduced to the polymer chain to make up for the insufficiency. Further, according to the need, one species or two species or more of low-molecular-weight hole-transporting or electron-transporting compounds are incorporated as additives in the polymer light-emitting material to the extent that such incorporation of additives does not harm the object of this invention and the resulting composition is used.

An organic electroluminescent device using the polymer light-emitting material of this invention will be explained below.

An organic electroluminescent device using the polymer light-emitting material of this invention has a plurality of organic layers between a pair of anode and cathode and the organic layers are preferably constituted of a hole-transporting layer and a light-emitting/electron-transporting layer, a hole-transporting/light-emitting layer and an electron-transporting layer, or a hole-transporting layer, a light-emitting layer, and an electron-transporting layer. Particularly preferable is a layered structure constituted of a hole-transporting layer, a light-emitting layer, and an electron-transporting layer. Further, in the fabrication of an organic electroluminescent device according to this invention, a protective layer may be provided for each of the organic layers after it is formed. Still further, a protective film may be provided to protect the device as a whole against moisture and oxygen.

Triphenylamine derivatives and PVK (polyvinylcarbazole) known as hole-transporting materials or tris(8-hydroxyquinolinato)aluminum (Alq3), oxadiazole derivatives, and imidazole derivatives known as electron-transporting materials are available for use in forming the hole-transporting layer or electron-transporting layer.

A hole-injecting layer may be disposed between the anode and the hole-transporting layer or the light-emitting layer to improve the efficiency of hole injection from the anode. An electrically conductive polymer such as a polythiophene derivative and a polypyrrole derivative can be used as a material for the hole-injecting layer. Of such electrically conductive polymers, a polythiophene derivative or poly(3,4-ethylenedioxythiophene)poly(styrenesulfonate) (PEDOT/PSS) is particularly preferable from the viewpoint of hole injection efficiency. The thickness of the hole-injecting layer is preferably not more than 200 nm, more preferably not more than 100 nm.

The anode has a function of supplying holes to the hole-injecting layer, the hole-transporting layer, or the light-emitting layer and is generally formed on a glass substrate. An anode material to be used in this invention is not specifically limited and examples include electrically conductive metal oxides such as indium tin oxide (ITO) and tin oxide and metals such as gold, silver, and platinum. Further, a commercially available ITO-coated glass plate may be used. A commercial ITO-coated glass plate is normally washed with an aqueous solution of a cleaning agent, then washed with a solvent, and finally cleaned in a UV-ozone cleaning apparatus or a plasma irradiation apparatus before use.

The cathode has a function of supplying electrons to the electron-transporting layer or the light-emitting layer and, although there is no specific restriction on an anode material to be used in this invention, a metal such as Li, Mg, Ca, and Al or an alloy thereof such as an Mg—Ag alloy and an Mg—Al alloy is used as a material for the cathode.

The cathode and the anode are formed by a known process such as vacuum vapor deposition and sputtering. The thickness of the cathode is preferably not more than 300 nm, more preferably not more than 200 nm. On the other hand, the thickness of the anode is preferably not more than 200 nm, more preferably not more than 100 nm.

The spin coating process is generally used for forming a film from a polymer light-emitting material, a polymer material for the hole-transporting layer, or a polymer material for the electron-transporting layer. In addition, other processes such as ink-jet printing, printing, spray coating, and dispensing of a coating solution from a dispenser nozzle are available for forming a film of large area from an organic polymer, but the process is not limited to them.

EXAMPLES

This invention will be explained concretely with reference to the examples, but will not be limited to these examples.

The compounds synthesized in the Synthetic Examples and the Examples were identified by one kind or more of analytical methods selected from $^1$H-NMR (solvent: deuterated chloroform, deuterated THF, or deuterated DMF), FD-MS, GPC, TGA, UV spectroscopy, PL spectroscopy, and IR spectroscopy.

Synthetic Example 1

The synthesis of 2-(3-methoxyphenyl)pyridine is carried out according to scheme (1). Then, 2-(3-methoxyphenyl)pyridine is hydrolyzed in the usual manner to give 2-(3-hydroxyphenyl)pyridine according to scheme (2).

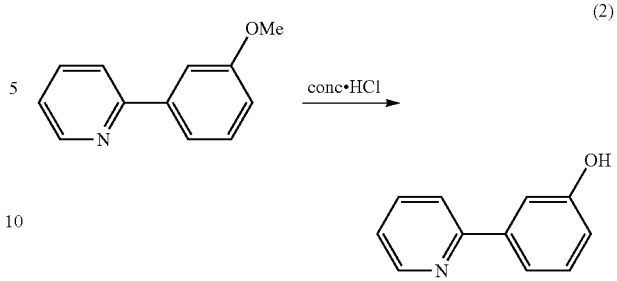

Then, 2-(3-hydroxyphenyl)pyridine is treated with tert-butyldimethylsilyl chloride (TBDMSCl) to protect the OH group with a tert-butyldimethylsilyl group and give 2-(3-tert-butyldimethylsilyloxyphenyl)pyridine according to scheme (3).

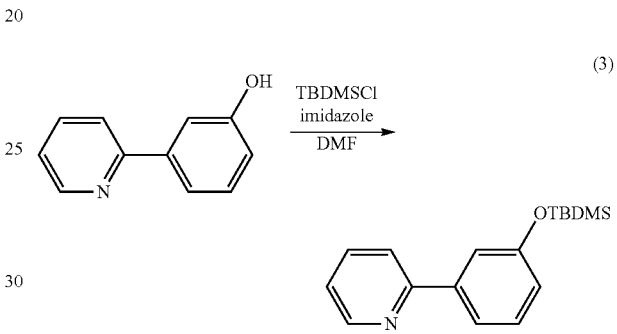

Then, 9.3 g (8.7 mmol) of bis(μ-chloro)tetrakis(2-phenylpyridine)diiridium(III), 9.6 g (33.5 mmol) of 2-(3-tert-butyldimethylsilyloxyphenyl)pyridine, and 4.9 g (17.1 mmol) of AgCF$_3$SO$_3$ were allowed to react in 300 ml of dehydrated toluene while heating the mixture under reflux for 3 hours according to scheme (4). The reaction mixture was filtered to remove the insoluble matters and the filtrate was concentrated and then purified by silica gel column chromatography to give 5.0 g of 2-(3-tert-butyldimethylsilyloxyphenyl)pyridine-bis(2-phenylpyridine)iridium (III) as a yellow powder. The yield is 54%.

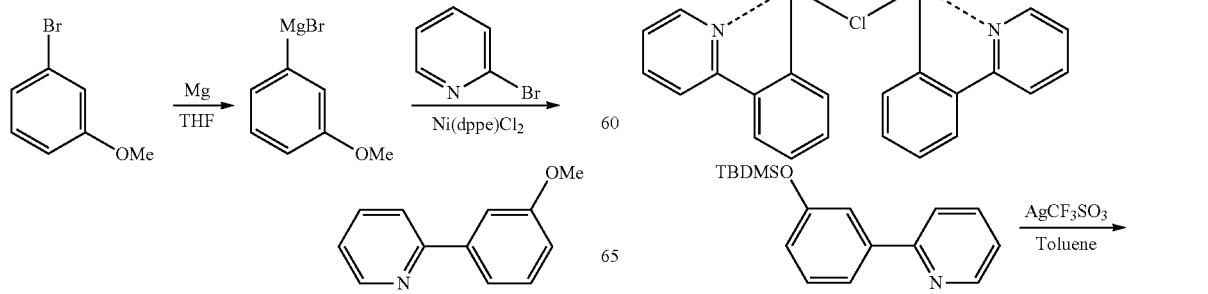

-continued

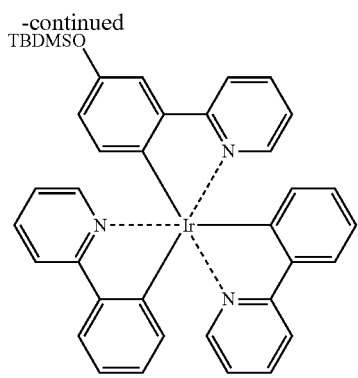

Then, 9 ml of a 1M THF solution of tetra-n-butylammonium fluoride (TBAS) was added to a THF solution of 3.5 g (4.5 mmol) of 2-(3-tert-butyldimethylsilyloxyphenyl)pyridine-bis(2-phenylpyridine)iridium (III) and the mixture was allowed to react at room temperature for 1 hour. The reaction mixture was filtered to remove the insoluble matters and the filtrate was concentrated and then purified by silica gel column chromatography to give 2.7 of 2-(3-hydroxyphenyl)pyridine-bis(2-phenylpyridine)iridium(III) as a yellow powder. The yield is 90%.

(5)

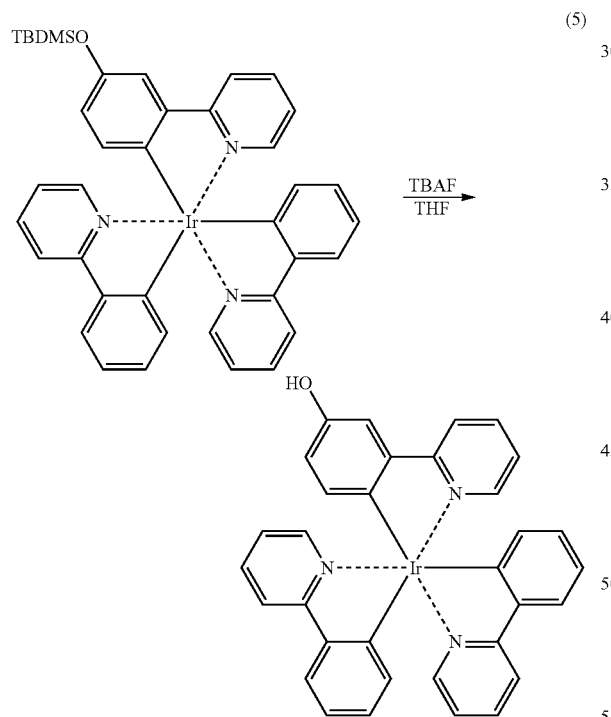

Synthetic Example 2

Commercially available p-chloromethylstyrene was passed through an alumina-filled column to remove a polymerization inhibitor therein contained. A solution of 13 g of this p-chloromethylstyrene in 3.3 g of ethylbenzene was prepared, the system was placed under a nitrogen atmosphere, and the solution was allowed to polymerize at 120° C. for 4 hours. The polymer solution was diluted and purified by reprecipitation using methanol to give 5.8 g of polychloromethylstyrene. When analyzed by GPC (mobile phase: THF), the polymer showed a weight average molecular weight (Mw) of 97,000 in terms of standard polystyrene and a molecular weight distribution of 2.8.

Example 1

Polychloromethylstyrene obtained in Synthetic Example 2 (hereinafter referred to as PCMS) and 2-(3-hydroxyphenyl)pyridine-bis(2-phenylpyridine)iridium(III) obtained in Synthetic Example 1 (hereinafter referred to as Ir(ppy)$_3$) were allowed to react to give Ir(ppy)$_3$-containing PCMS. Concretely, as illustrated in scheme (6), 0.11 g (0.17 mmol) of Ir(ppy)$_3$ was dissolved in 25 ml of DMF, 0.5 g of PCMS and 0.27 g of K$_2$CO$_3$ as a catalyst were added, the system was placed under a nitrogen atmosphere, and the mixture was allowed to react at 50° C. for 44 hours. The reaction mixture was diluted, the catalyst was filtered off, and the polymer was purified by reprecipitation using water. The purified polymer was recovered and repeatedly reslurried in methanol to give 0.68 g of Ir(ppy)$_3$-containing PCMS (E-1), which is the polymer shown at the right end of scheme (6). The polymer was identified by GPC, TGA, and IR spectroscopy. When analyzed by GPC (mobile phase: chloroform), the polymer showed an Mw of 93,000 in terms of standard polystyrene and a molecular weight distribution of 2.6. The content of Ir was 5.3 wt % based on the polymer. The iridium content was determined from the residue of TGA and it is the amount of iridium existing as metal in the polymer or Ir(ppy)$_3$-containing PCMS.

(6)

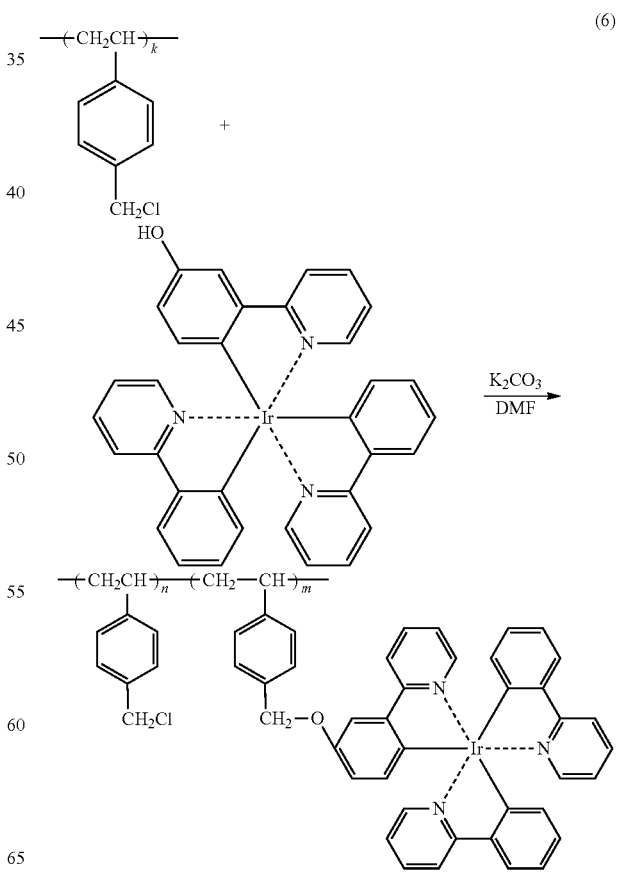

The luminous characteristics of this polymer was evaluated on the basis of the PL characteristics in solution and the luminous characteristics of an organic electroluminescent device fabricated using the polymer.

Example 2

To evaluate the PL characteristics of the polymer obtained in Example 1, a DMF solution of the polymer with a concentration of 1 mg/ml was prepared, the maximum wavelength of the emitted light was determined with the aid of a UV spectrophotometer, and using this maximum wavelength as an excitation wavelength, the PL intensities were measured at various concentrations with the aid of a PL spectrophotometer. The maximum PL intensity was 1,650. The PL intensities determined in the examples are shown in Table 1 relative to this value of 1,650 taken as 100.

Example 3

An organic electroluminescent device used in the aforementioned evaluation was fabricated from the polymer obtained in Example 1 as follows. A glass substrate coated with a 150 nm-thick ITO film was submitted first to cleaning with a solvent and then to UV/ozone cleaning. A film of poly(3,4-ethylenedioxythiophene) (polystyrene sulfonate) (PEDOT/PSS) (manufactured by H. C. Starck GmbH; tradename, Clevios PCH8000) was formed on this ITO-coated glass substrate to a thickness of 25 nm as a hole-injecting layer. Then, a 2 wt % solution of Ir(ppy)$_3$-containing PCMS (E-1) in tetrachloroethane was prepared and applied by spin coating to a thickness of 70 nm to form a light-emitting layer. Then, using a vacuum vapor deposition apparatus, Alq3 was deposited to a thickness of 35 nm and LiF/Al as a cathode was deposited to a thickness of 170 nm. Finally, the device thus fabricated was encapsulated in a glove box.

The organic electroluminescent device thus obtained was connected to an outside power source and, upon application of a 10-V direct current voltage, the device was confirmed to display the luminous characteristics shown in Table 1. The luminance in Table 1 is measured at 20 mA/cm$^2$. The maximum wavelength of the emission spectrum of the device was 550 nm and a green light originating from the iridium complex was observed.

Example 4

The synthesis of Ir(ppy)$_3$-containing PCMS (E-2) was carried out as in Example 1 except that the amount of Ir(ppy)$_3$ was changed to 0.22 g (0.34 mmol). This polymer showed an Mw of 92,000 and a molecular weight distribution of 2.6. The content of Ir metal introduced to the polymer was 9.2 wt %.

Example 5

The synthesis of Ir(ppy)$_3$-containing PCMS (E-3) was carried out as in Example 1 except that the amount of Ir(ppy)$_3$ was changed to 0.66 g (1.02 mmol). This polymer showed an Mw of 90,000 and a molecular weight distribution of 2.5. The content of Ir metal introduced to the polymer was 15.9 wt %.

Example 6

The synthesis of Ir(ppy)$_3$-containing PCMS (E-4) was carried out as in Example 1 except that polychloromethylstyrene having an Mw of 27,000 and a molecular weight distribution of 1.8 was used. This polymer showed an Mw of 29,000 and a molecular weight distribution of 2.5. The content of Ir metal introduced to the polymer was 8.8 wt %.

Example 7

Hydroxytriphenylamine (HTPA) having a hole transport property was allowed to react with the residual chloromethyl groups of Ir(ppy)$_3$-containing PCMS (E-2) obtained in Example 4 to synthesize HTPA-modified Ir(ppy)$_3$-containing PCMS. Concretely, as illustrated in scheme (7), 0.3 g of Ir(ppy)$_3$-containing PCMS (E-2) was dissolved in 20 ml of DMF, 0.92 g of HTPA and 0.29 g of K$_2$CO$_3$ as a catalyst were added, the system was placed under a nitrogen atmosphere, and the mixture was allowed to react at 50° C. for 68 hours. The reaction mixture was diluted, the catalyst was filtered off, and the polymer was purified by reprecipitation using water. The purified polymer was thrown into methanol and repeatedly reslurried to give 0.39 g of HTPA-modified Ir(ppy)$_3$-containing PCMS (E-5). The polymer thus obtained was identified by GPC, TGA, and IR spectroscopy. The polymer showed an Mw of 94,000 and a molecular weight distribution of 2.5. The content of Ir metal introduced to the polymer was 4.8 wt %. Further, tracking of the methylene proton in the residual chloromethyl group by $^1$H-NMR confirmed that HTPA was introduced nearly quantitatively.

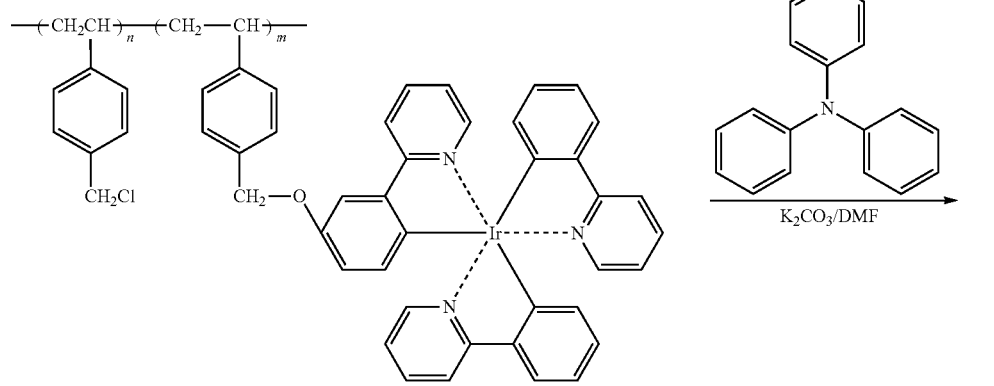

(7)

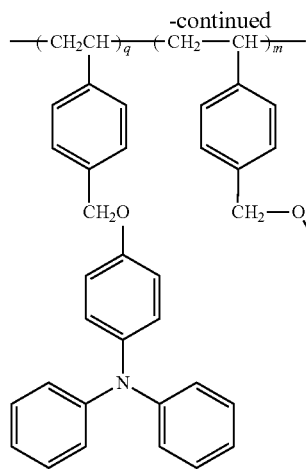
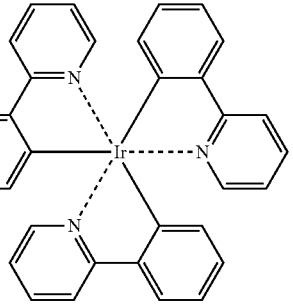

Example 8

HTPA-modified Ir(ppy)$_3$-containing PCMS (E-6) was obtained as in Example 7 except that Ir(ppy)$_3$-containing PCMS (E-1) obtained in Example 1 was substituted for Ir(ppy)$_3$-containing PCMS (E-2). The polymer showed an Mw of 90,000 and a molecular weight distribution of 2.4. The content of Ir metal introduced to the polymer was 2.7 wt %. Further, nearly quantitative introduction of HTPA was confirmed.

Example 9

Three species of HTPA-modified Ir(ppy)$_3$-containing PCMS's, (E-7) to (E-9), were obtained as in Example 7 except that three species of Ir(ppy)$_3$-containing PCMS's differing from one another were used.

Example 9-1

HTPA-modified Ir(ppy)$_3$-containing PCMS (E-7): Ir content, 1.8 wt %; Mw, 93,000; molecular weight distribution, 2.5.
Ir(ppy)$_3$-containing PCMS used in modification: Ir content, 3.5 wt %; Mw, 88,000; molecular weight distribution, 2.4.

Example 9-2

HTPA-modified Ir(ppy)$_3$-containing PCMS (E-8): Ir content, 7.8 wt %; Mw, 94,000; molecular weight distribution, 2.6.
Ir(ppy)$_3$-containing PCMS used in modification: Ir content, 12.9 wt %; Mw, 96,000; molecular weight distribution, 2.6.

Example 9-3

HTPA-modified Ir(ppy)$_3$-containing PCMS (E-9): Ir content, 9.8 wt %; Mw, 91,000; molecular weight distribution, 2.5.
Ir(ppy)$_3$-containing PCMS used in modification: Ir content, 16.2 wt %; Mw, 90,000; molecular weight distribution, 2.5.

Example 10

The residual chloromethyl groups of Ir(ppy)$_3$-containing PCMS (E-2) synthesized in Example 4 were allowed to react with an oxadiazole (OXD) which is a compound having an electron transport property to give OXD-modified Ir(ppy)$_3$-containing PCMS (E-10).

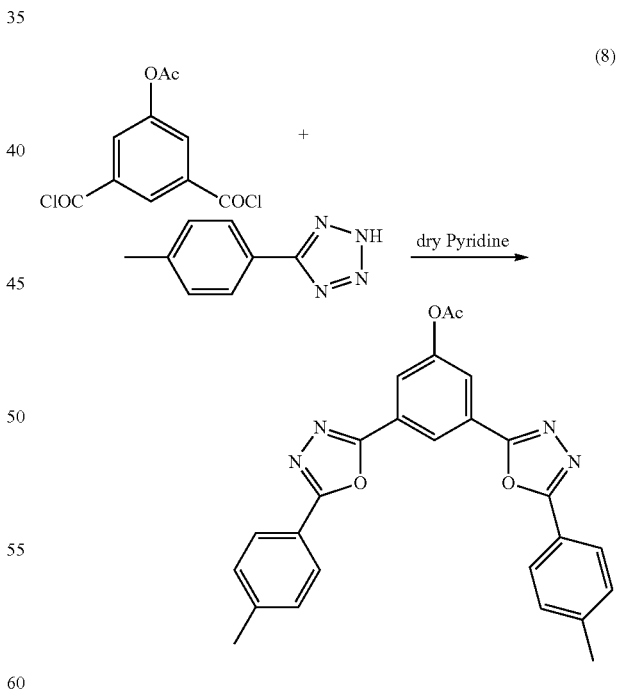

(8)

First, 1-acetoxy-3,5-bis[5-(p-tolyl)-2-oxadiazolyl]benzene was synthesized according to scheme (8). The reaction of 0.58 g (2.2 mmol) of 5-acetoxyisophthaloyl chloride with 0.71 g (4.5 mmol) of 5-(p-tolyl)-1H-tetrazole was carried out in pyridine at 90° C. for 18 hours. The reaction mixture was thrown into an aqueous solution of hydrochloric acid, filtered, and dried to give 0.91 g of 1-acetoxy-3,5-bis[5-(p-tolyl)-2-oxadiazolyl]benzene. The yield is 91%.

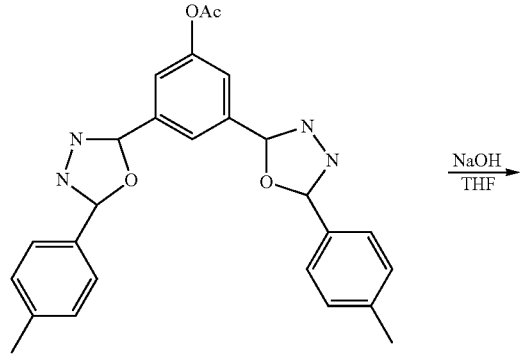

(9)

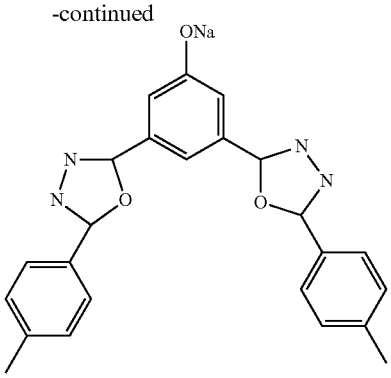

Then, according to scheme (9), sodium 3,5-bis[5-(p-tolyl)-2-oxadiazolyl]phenolate (OXD-Na) was synthesized. The reaction of 0.1 g (0.22 mmol) of 1-acetoxy-3,5-bis[5-(p-tolyl)-2-oxadiazolyl]benzene with 0.71 g (4.5 mmol) of 1N aqueous NaOH solution (400 g NaOH/l) was carried out in THF at 120° C. for 2 hours. The reaction mixture was filtered and dried to give 0.09 g (0.22 mmol) of sodium 3,5-bis[5-(p-tolyl)-2-oxadiazolyl]phenolate.

(10)

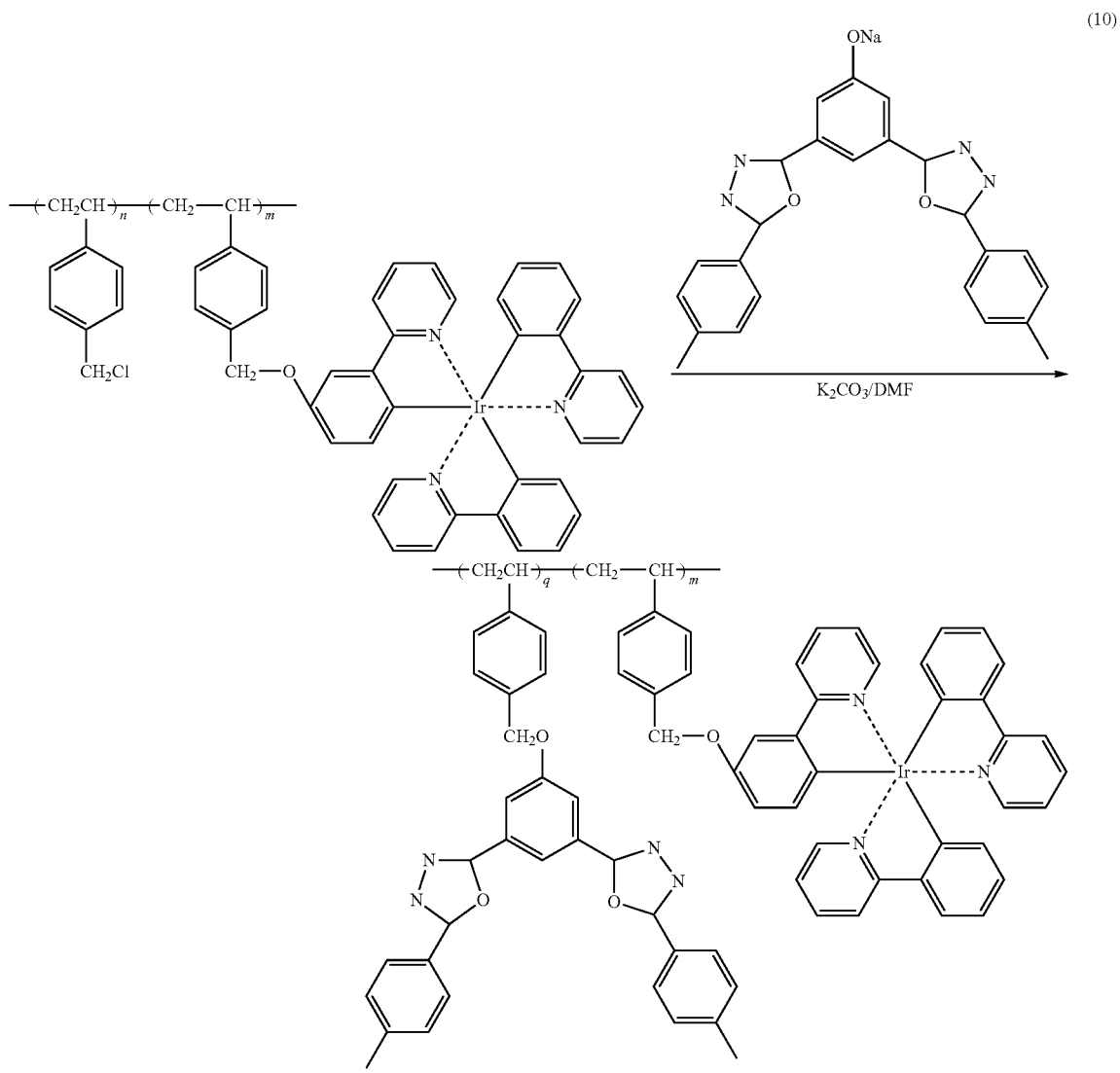

Then, as illustrated in scheme (10), 0.3 g of Ir(ppy)$_3$-containing PCMS (E-2) was dissolved in 20 ml of DMF, 0.3 g of OXD-Na and 0.1 g of K$_2$CO$_3$ as a catalyst were added, the system was placed under a nitrogen atmosphere, and the mixture was allowed to react at 50° C. for 47 hours. The reaction mixture was diluted, the catalyst was filtered off, and the polymer was purified by reprecipitation using water. The purified polymer was recovered and repeatedly reslurried in methanol to give 0.1 g of OXD-modified Ir(ppy)$_3$-containing PCMS (E-10). The polymer showed an Mw of 102,000 and a molecular weight distribution of 3.0. The content of Ir metal introduced to the polymer was 3.6 wt %.

Synthetic Example 3

Synthesis of 2-(3-hydroxyphenyl)pyridine bis(2-phenylbenzothiazole)iridium(III) (hereinafter referred to as Bt$_2$Ir(ppy))

According to scheme (11), 8.8 g (14.9 mmol) of iridium chloride n hydrate was dissolved in 450 ml of 2-ethoxyethanol, the system was placed under a nitrogen atmosphere, 15.5 g (73.4 mmol) of 2-phenylbenzothiazole was added, and the mixture was allowed to react at 120° C. for 6 hours. The reaction mixture was cooled to room temperature, filtered, and dried to give 13.7 g of bis(μ-chloro)tetrakis(2-phenylbenzothiazole) diiridium(III) as a reddish brown powder. The yield is 85%.

(11)

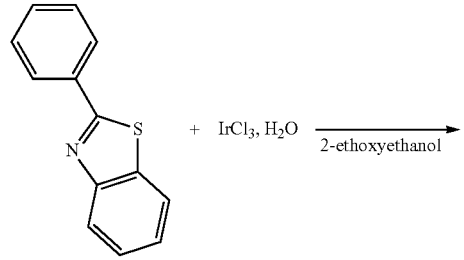

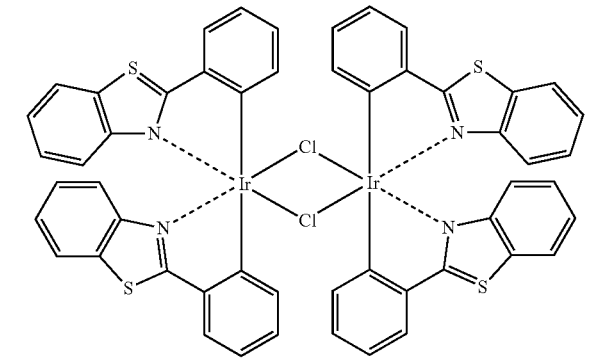

Then, according to scheme (12), 4.9 g (3.8 mmol) of bis(μ-chloro)tetrakis(2-phenylbenzothiazole) diiridium(III) obtained above, 5.1 g (19.0 mmol) of 2-(3-tert-butyldimethylsilyloxyphenyl)pyridine, and 2.5 g (9.8 mmol) of AgCF$_3$SO$_3$ were heated in 25 ml of dehydrated toluene at 120° C. under reflux for 3 hours. The insoluble matters were removed from the reaction mixture by filtration and the filtrate was concentrated and repeatedly purified by silica gel column chromatography to give 2.5 g of 2-(3-tert-butyldimethylsilyloxyphenyl)pyridine-bis(2-phenylbenzothiazole) iridium(III) as a yellow powder.

(12)

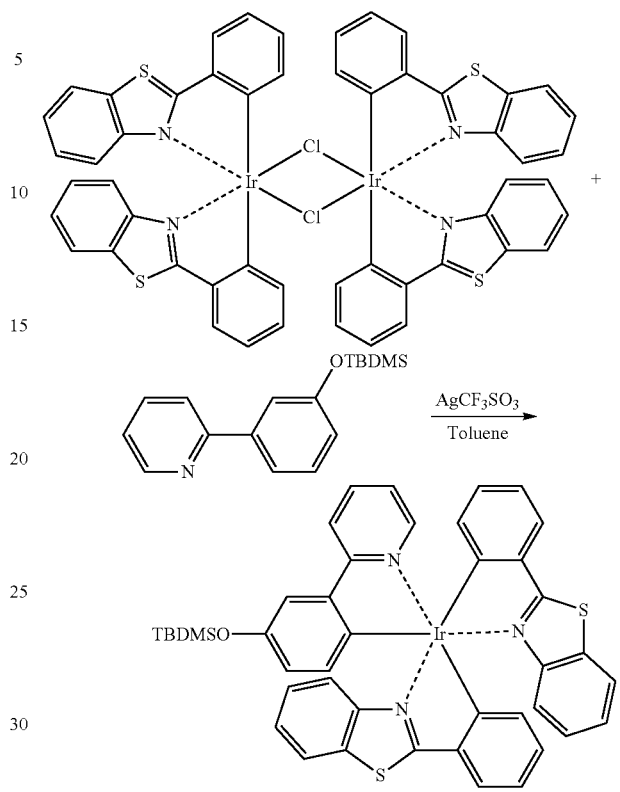

Then, according to scheme (13), 1.2 ml of a 1M THF solution of tetra-n-butylammonium fluoride (TBAF) was added to a THF solution of 0.5 g (0.56 mmol) of 2-(3-tert-butyldimethylsilyloxyphenyl)pyridine-bis(2-phenylpyridine)iridium(III) and the mixture was allowed to react at room temperature for 1 hour. The insoluble matters were removed from the reaction mixture by filtration and the filtrate was concentrated and purified by silica gel column chromatography to give 0.4 g of Bt$_2$Ir(ppy) as a yellow powder. The yield is 92%.

(13)

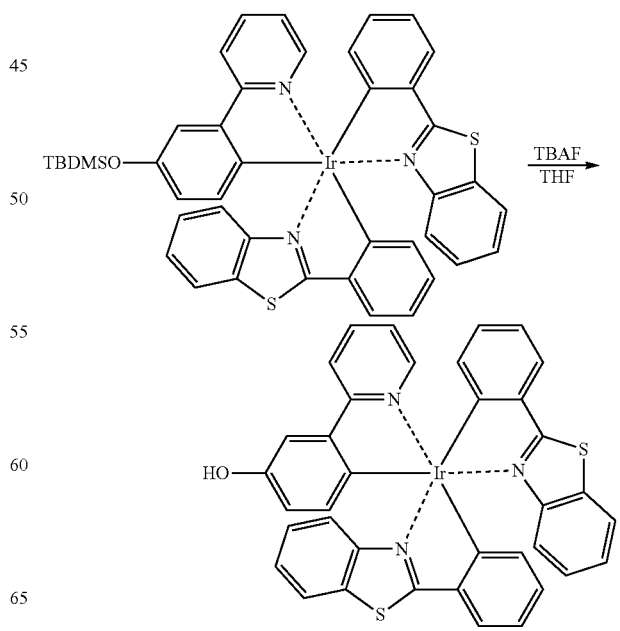

Example 11

Bt₂Ir(ppy)-containing PCMS (E-11) was synthesized from Bt₂Ir(ppy) obtained in Synthetic Example 3 and polychloromethylstyrene obtained in Synthetic Example 2.

According to scheme (14), 0.26 g (0.33 mmol) of Bt₂Ir(ppy) was dissolved in 25 ml of DMF, 0.5 g of polychloromethylstyrene obtained in Synthetic Example 2 and 0.27 g of K₂CO₃ as a catalyst were added, the system was placed under a nitrogen atmosphere, and the mixture was allowed to react at 50° C. for 21 hours. The reaction mixture was diluted, the catalyst was filtered off, and the polymer was purified by reprecipitation using water. The purified polymer was recovered and repeatedly reslurried in methanol to give 0.67 g of Bt₂Ir(ppy)-containing PCMS (E-11). The polymer showed an Mw of 96,000 and a molecular weight distribution of 2.6. Further, the content of Ir metal introduced to the polymer was 8.7 wt %.

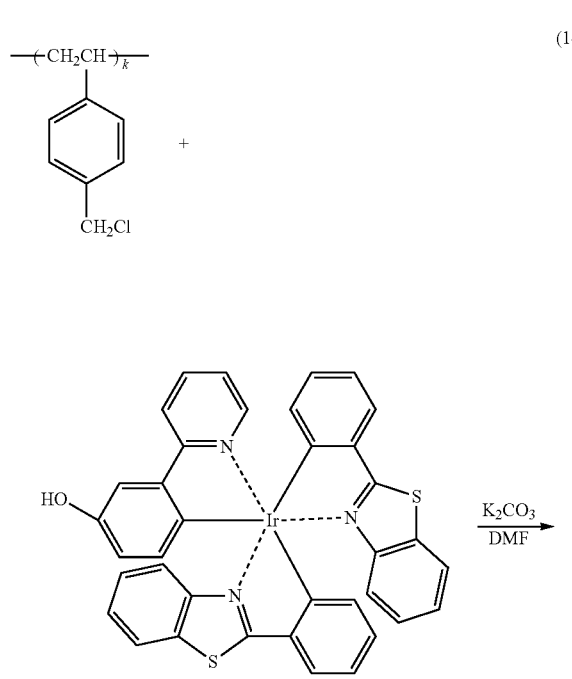

(14)

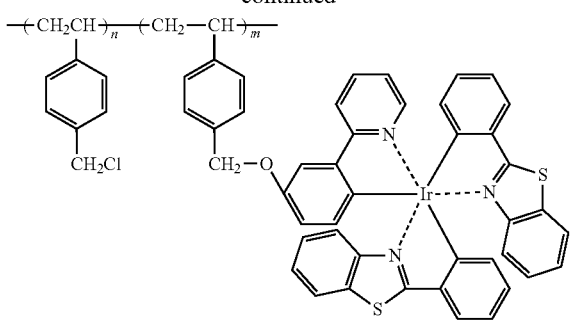

Example 12

The residual chloromethyl groups of Bt₂Ir(ppy)-containing PCMS (E-11) obtained in Synthetic Example 11 were treated with hydroxytriphenylamine (HTPA) to synthesize HTPA-modified Bt₂Ir(ppy)-containing PCMS (E-12). According to scheme (15), 0.2 g of Bt₂Ir(ppy)-containing PCMS (E-11) was dissolved in 20 nil of DMF, 0.62 g of HTPA and 0.2 g of K₂CO₃ as a catalyst were added, the system was placed under a nitrogen atmosphere, and the mixture was allowed to react at 50° C. for 45 hours. The reaction mixture was diluted, the catalyst was filtered off, and the polymer was purified by reprecipitation using water. The purified polymer was recovered and repeatedly reslurried in methanol to give 0.38 g of HTPA-modified Bt₂Ir(ppy)-containing PCMS (E-12). The polymer showed an Mw of 101,000 and a molecular weight of 2.8. The content of Ir metal introduced to the polymer was 4.1 wt %. Further, nearly quantitative introduction of HTPA was confirmed by tracking the methylene proton in the residual chloromethyl group by ¹H-MNR.

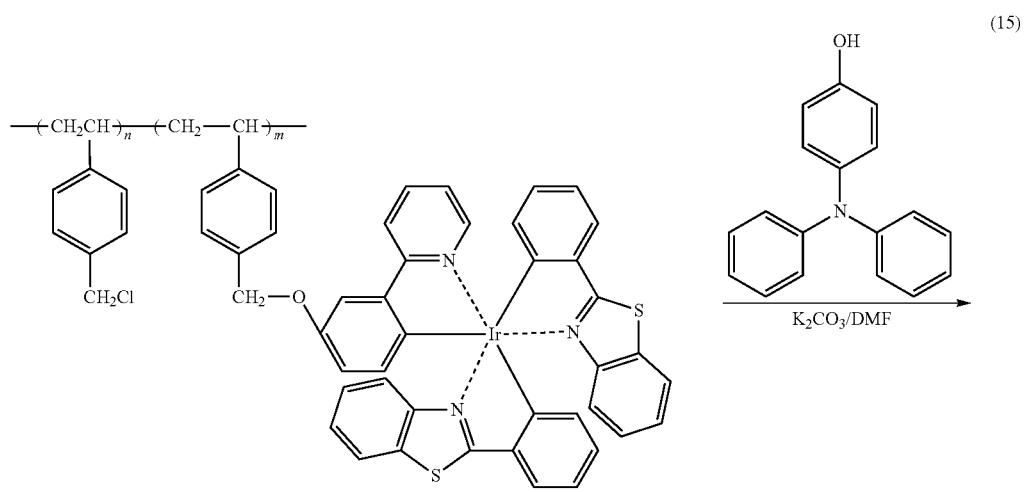

(15)

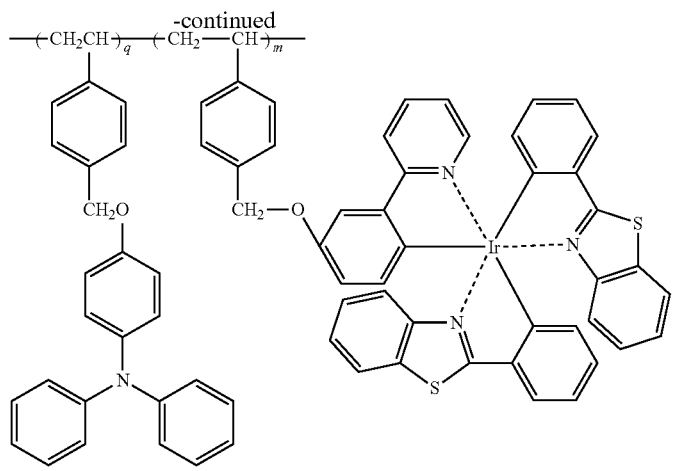

Example 13

HTPA-modified Bt$_2$Ir(ppy)-containing PCMS (E-14) was synthesized as in Example 10 except that Bt$_2$Ir(ppy)-containing PCMS (E-13) (content of Ir metal, 5.8 wt %; Mw, 92,000; molecular weight distribution, 2.5) was substituted for Bt$_2$Ir(ppy)-containing PCMS (E-11). The polymer showed an Mw of 95,000 and a molecular weight distribution of 2.6. Further, the content of Ir metal introduced to the polymer was 2.1 wt %.

Comparative Example 1

The synthesis of Ir(ppy)$_3$-containing PCMS was carried out using the technique of copolymerization. First, iridium complex-containing monomer 1-1 (a) was synthesized according to scheme (16) disclosed in Example 1 of JP2006-8996 A.

(16)

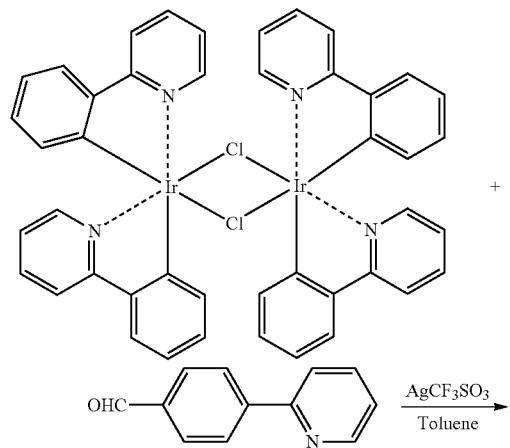

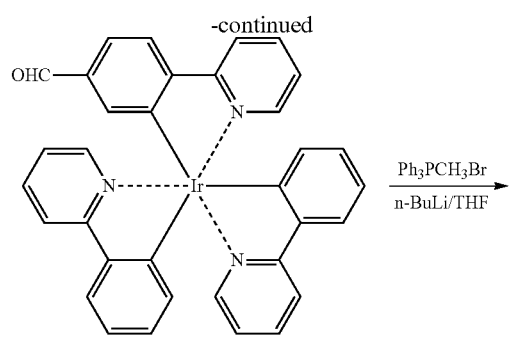

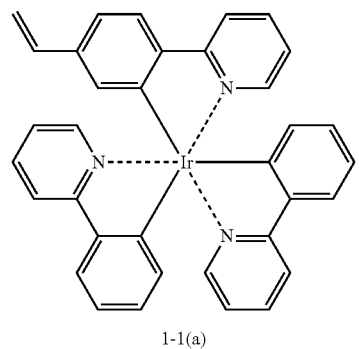

1-1(a)

Then, according to scheme (17), 0.4 g of p-chloromethylstyrene from which a polymerization inhibitor had been removed was thrown into 3.0 g of DMF, the system was placed under a nitrogen atmosphere, and the mixture was allowed to polymerize at 120° C. for 6 hours. The reaction mixture was diluted and the polymer was purified by reprecipitation using methanol to give 1.4 g of Ir(ppy)$_3$-containing PCMS (E-15). The polymer showed an Mw of 36,000 and a molecular weight distribution of 2.6. The content of Ir metal introduced to the polymer was 5.2 wt %.

(17)

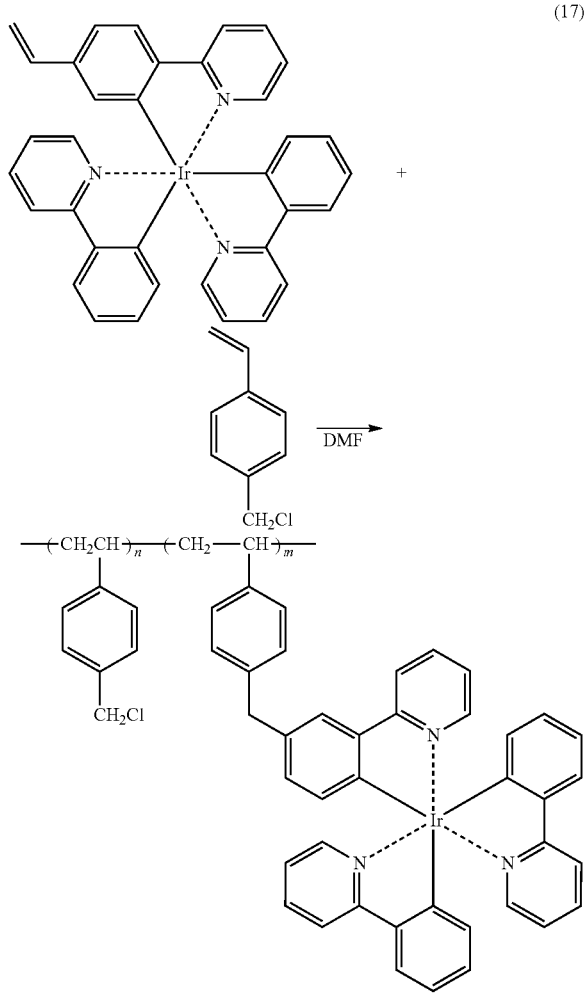

Comparative Example 2

The copolymerization reaction was carried out as in Comparative Example 1 by changing the composition of charged iridium complex-containing monomer 1-1 (a) and p-chloromethylstyrene with the content of Ir metal aimed at 9 wt % or so. However, the solubility of iridium complex-containing monomer 1.1 (a) was extremely low, a heterogeneous system resulted, and the desired polymer was not obtained.

Comparative Example 3

HTPA-modified Ir(ppy)$_3$-containing PCMS (E-17) was synthesized as in Example 7 except that Ir(ppy)$_3$-containing PCMS (E-16) (content of Ir metal, 8.8 wt %; Mw, 1,800; molecular weight distribution, 1.8) was substituted for Ir(ppy)$_3$-containing PCMS (E-2). The polymer thus modified showed a content of Ir metal of 4.3 wt %, an Mw of 1,700, and a molecular weight distribution of 1.8; however, a film formed from the polymer was extremely brittle and it was not possible to form a uniform film during fabrication of a device.

Comparative Example 4

HTPA-modified Ir(ppy)$_3$-containing PCMS (E-19) was synthesized as in Example 7 except that Ir(ppy)$_3$-containing PCMS (E-18) (content of Ir metal, 8.6 wt %; Mw, 1,150,000; molecular weight distribution, 3.6) was substituted for Ir(ppy)$_3$-containing PCMS (E-2). The content of Ir metal in the polymer was 4.2 wt %; however, the solubility was extremely low and it was not possible to form a film from the polymer.

The characteristics of the polymers synthesized in Examples and Comparative Examples are evaluated and the results are shown in Table 1. The modifier in the table refers to a compound used to modify the residual chloromethyl groups.

TABLE 1

|  | Ir complex | Modifier | Mw (×10$^4$) | Ir content (wt %) | PL relative intensity | Luminance (cd/m$^2$) |
|---|---|---|---|---|---|---|
| Ex. | | | | | | |
| 1 | Ir(ppy)$_3$ | none | 9.3 | 5.3 | 100 | 2200 |
| 4 | Ir(ppy)$_3$ | none | 9.2 | 9.2 | 91 | 1900 |
| 5 | Ir(ppy)$_3$ | none | 9.0 | 15.9 | 131 | 3400 |
| 6 | Ir(ppy)$_3$ | none | 2.9 | 8.8 | 89 | 2000 |
| 7 | Ir(ppy)$_3$ | HTPA | 9.4 | 4.9 | 86 | 2400 |
| 8 | Ir(ppy)$_3$ | HTPA | 9.0 | 2.7 | 139 | 2500 |
| 9-1 | Ir(ppy)$_3$ | HTPA | 9.3 | 1.8 | 81 | 1800 |
| 9-2 | Ir(ppy)$_3$ | HTPA | 9.4 | 7.8 | 164 | 2500 |
| 9-3 | Ir(ppy)$_3$ | HTPA | 9.1 | 9.8 | 202 | 3500 |
| 10 | Ir(ppy)$_3$ | OXD | 10.2 | 3.6 | 97 | 2100 |
| 12 | Bt$_2$Ir(ppy) | HTPA | 10.1 | 4.1 | 241 | 4000 |
| 13 | Bt$_2$Ir(ppy) | HTPA | 9.5 | 2.1 | 151 | 3600 |
| Comp. Ex. | | | | | | |
| 1 | Ir(ppy)$_3$ | none | 3.6 | 5.2 | 46 | 900 |
| 2 | Ir(ppy)$_3$ | none | — | — | — | — |
| 3 | Ir(ppy)$_3$ | HTPA | 0.17 | 4.3 | 92 | — |
| 4 | Ir(ppy)$_3$ | HTPA | 115.0 | 4.2 | — | — |

INDUSTRIAL APPLICABILITY

A polymer light-emitting material in this invention displays enhanced luminous efficiency and excellent film-formability. Further, the material allows application of a coating method to film forming and facilitates fabrication of a device of large area. An organic electroluminescent device using the material performs at high luminous efficiency.

The invention claimed is:

1. A method for producing a polymer light-emitting material for an organic electroluminescent device which comprises:
mixing a thermoplastic resin having a weight average molecular weight of 2,000-1,000,000 and containing a reactive functional group in a unit constituting the backbone and a metal-containing phosphorescent dopant compound comprising an organic metal complex containing at least one metal selected from ruthenium, rhodium, palladium, silver, rhenium, osmium, iridium, platinum, and gold and containing a reactive group capable of reacting with the said functional group to form a linkage and
allowing the said functional group to react with the said reactive group so as to link a phosphorescent dopant moiety derived from the metal-containing phosphorescent dopant compound to the unit constituting the backbone of the thermoplastic resin;
wherein the content of the metal in the said polymer light-emitting material is 0.001-20 wt %; and wherein the thermoplastic resin is a polyhaloalkylaromatic vinyl resin and the reactive functional group is a haloalkyl group.

2. A method for producing a polymer light-emitting material which comprises:

first allowing a thermoplastic resin having a weight average molecular weight of 2,000-1,000,000 and containing a reactive functional group in a unit constituting the backbone to react first partly with a metal-containing phosphorescent dopant compound comprising an organic metal complex containing at least one metal selected from ruthenium, rhodium, palladium, silver, rhenium, osmium, iridium, platinum, and gold and containing a reactive group capable of reacting with the said functional group to form a linkage and then with a carrier-transporting compound containing a reactive group capable of reacting with the said functional group to form a linkage so as to link a phosphorescent dopant moiety derived from the metal-containing phosphorescent dopant compound and a carrier-transporting compound moiety derived from the carrier-transporting compound to the unit constituting the backbone of the thermoplastic resin;

wherein the content of the metal in the said polymer light-emitting material is 0.001-20 wt %; and wherein the thermoplastic resin is a polyhaloalkylaromatic vinyl resin and the reactive functional group is a haloalkyl group.

3. The method for producing a polymer light-emitting material described in claim 1, wherein the polyhaloalkylaromatic vinyl resin is a polychloromethyl styrene resin.

4. The method for producing a polymer light-emitting material described in claim 1, wherein the metal-containing phosphorescent dopant compound is an organic metal complex containing iridium.

5. The method for producing a polymer light-emitting material described in claim 1, wherein the reactive group of the metal-containing phosphorescent dopant compound is a hydroxyl group or an alkoxide group.

* * * * *